United States Patent
Li et al.

(10) Patent No.: US 11,108,389 B2
(45) Date of Patent: Aug. 31, 2021

(54) ADAPTIVE GATE DRIVERS AND RELATED METHODS AND SYSTEMS

(71) Applicant: TEXAS INSTRUMENTS INCORPORATED, Dallas, TX (US)

(72) Inventors: Xiong Li, Allen, TX (US); Adam Lee Shook, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/020,608

(22) Filed: Sep. 14, 2020

(65) Prior Publication Data

US 2020/0412361 A1 Dec. 31, 2020

Related U.S. Application Data

(62) Division of application No. 16/428,455, filed on May 31, 2019, now Pat. No. 10,784,857.

(51) Int. Cl.
*H03K 17/567* (2006.01)
*B60R 16/033* (2006.01)
*H03K 17/687* (2006.01)
*H03K 17/60* (2006.01)
*H03K 17/74* (2006.01)

(52) U.S. Cl.
CPC ......... *H03K 17/567* (2013.01); *B60R 16/033* (2013.01); *H03K 17/602* (2013.01); *H03K 17/6872* (2013.01); *H03K 17/74* (2013.01)

(58) Field of Classification Search
CPC .... H03K 17/567; H03K 17/74; H03K 17/602; H03K 17/6872; B60R 16/033
See application file for complete search history.

(56) References Cited

U.S. PATENT DOCUMENTS 9,628,072 B2 * 4/2017 Toshiyuki ............... H02M 1/08

OTHER PUBLICATIONS

Lobsiger et al., "Closed-Loop di/dt and dv/dt IGBT Gate Drive Concepts," ECPE Tutorial, Power Semiconductor Devices & Technologies, Jun. 6-7, 2013, Zurich (64 pages).

* cited by examiner

*Primary Examiner* — Jung Kim
(74) *Attorney, Agent, or Firm* — Michael A. Davis, Jr.; Charles A. Brill; Frank D. Cimino

(57) ABSTRACT

In a gate driver, a comparator input is adapted to be coupled through a resistor and a diode to a first transistor. A latch input is coupled to a comparator output. A second transistor has a first control terminal and a first output terminal. The first output terminal is adapted to be coupled to a control terminal of the first transistor. A third transistor is smaller than the second transistor. The third transistor has a second control terminal and a second output terminal. The second output terminal is adapted to be coupled to the control terminal of the first transistor. Control logic has a logic input and first and second logic outputs. The logic input is coupled to a latch output. The first logic output is coupled to the first control terminal. The second logic output is coupled to the second control terminal.

15 Claims, 8 Drawing Sheets

ADAPTIVE GATE DRIVERS AND RELATED METHODS AND SYSTEMS

CROSS-REFERENCE TO RELATED APPLICATION

This application is a divisional of U.S. patent application Ser. No. 16/428,455 filed May 31, 2019 (issued as U.S. Pat. No. 10,784,857 on Sep. 22, 2020), which is incorporated herein by reference.

TECHNICAL FIELD

This description relates generally to gate drivers, and more particularly to adaptive gate drivers and related methods and systems.

BACKGROUND

High-voltage and/or high-current applications require power electronic devices capable of efficient and effective operation at elevated temperatures. In such applications, power modules deliver power using power devices such as, metal-oxide-semiconductor field-effect transistors (MOSFETs), insulated-gate bipolar transistors (IGBTs), etc. A driver may be used to control a power device used as a power delivering device to support tens or hundreds of amperes during normal operation to deliver the power to a load.

DETAILED DESCRIPTION OF EXAMPLE EMBODIMENTS

Figure 1A:
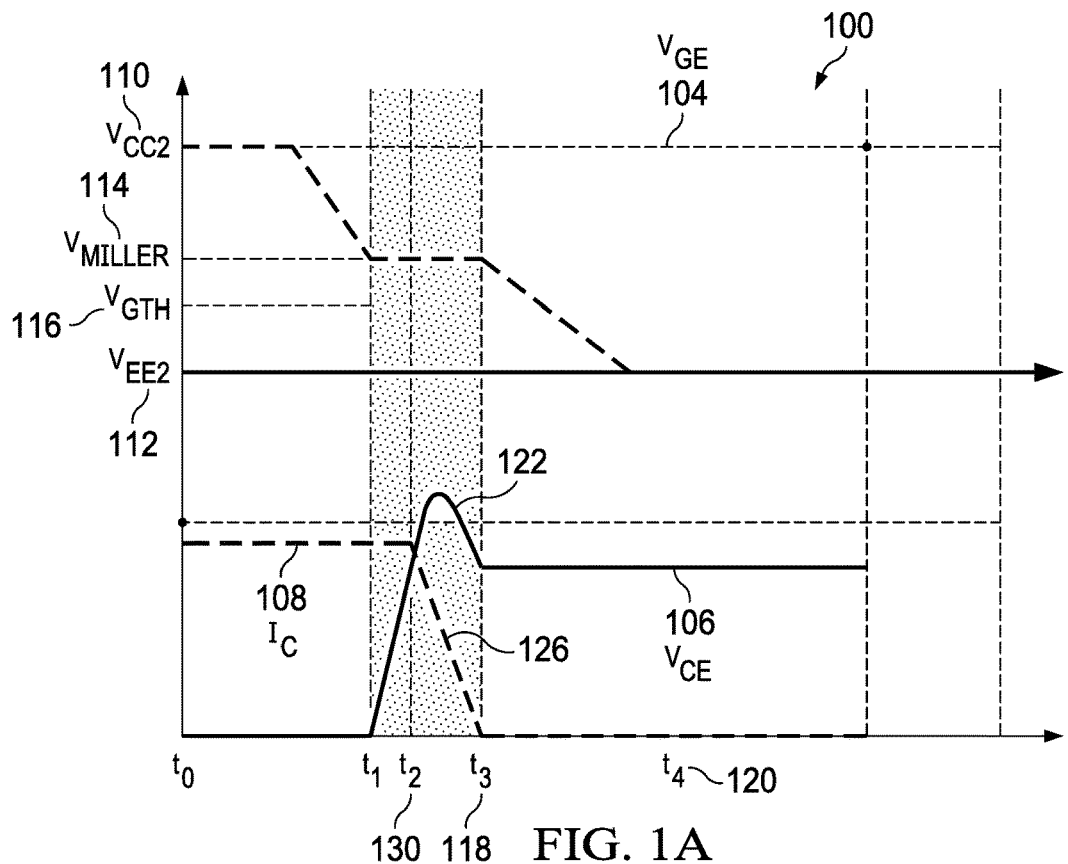
FIG. 1A is a first graph corresponding to a first switching commutation scenario of a transistor being controlled by a gate driver at a first switching speed.

The drawings are not to scale. Generally, in this description, the same reference numbers throughout the drawings refer to the same or like parts. Connecting lines or connectors shown in the drawings represent example functional relationships and/or physical or logical couplings between the various elements.

Descriptors "first," "second," "third," etc. are used herein when identifying multiple elements or components, which may be referred to separately. Unless otherwise specified or understood based on their context of use, such descriptors do not impute any meaning of priority or ordering in time, but are merely labels referring to multiple elements or components separately for ease of understanding the described examples. In some examples, the descriptor "first" may refer to an element in this description, while the same element may be referred to in a claim with a different descriptor, such as "second" or "third." In such instances, such descriptors are merely for ease of referencing multiple elements or components.

High-voltage and/or high-current isolated gate driver environments and applications, such as a traction inverter in an electric vehicle (EV), a hybrid-electric vehicle (HEV), etc., require power electronic devices capable of efficient and effective operation at elevated temperatures. Power delivery and/or management modules deliver power using low-impedance insulated-gate bipolar transistors (IGBTs), metal-oxide-semiconductor field-effect transistors (MOSFETs), etc., made from Silicon Carbide (SiC). Power SiC transistors may be used to deliver tens or hundreds of amperes to a load during normal operation.

Typical gate drivers can be used to control power transistors (e.g., to turn the power transistor on/off or to enable/disable the power transistor). Achieving lower switching loss of the power transistors while operating the power transistors in a safe-operating area (SOA) is desirable. For instance, by using a stronger drive strength (e.g., by providing more current or higher voltage to a gate of the power transistor, by providing a discharge path to the gate that can reduce the current or voltage at the gate at a faster rate, etc.), the typical gate drivers may reduce the switching loss of the power transistors, but higher voltage spikes can be generated by the power transistor and fed back into a corresponding circuit as a result. For example, a drive strength can correspond to a pullup strength, a pulldown strength, etc., of a gate driver component and/or, more generally, a gate driver. In such instances, diodes, such as transient-voltage-suppression (TVS) diodes, are used to protect power transistors from damage due to voltage spikes. In other instances, gate drivers with a weaker drive strength may increase the switching loss of the power transistors, but lower voltage spikes may result. Accordingly, smaller TVS diodes can be used with the weaker drive strength because the voltage spikes are not as large compared to instances with the stronger drive strength.

Examples herein include adaptive gate drivers and related methods and systems. In some described examples, a power delivery system includes a power transistor and a diode (e.g., a TVS diode) to protect the power transistor from voltage spikes due to switching events of the power transistor. In some described examples, an example gate driver enables the power transistor to have increased switching speeds with reduced switching loss while limiting voltage spikes across the power transistor to be within the SOA region of the power transistor. In some described examples, the gate driver detects an overvoltage condition and adapts a driver strength of the gate driver responsive to the detected overvoltage condition.

In some described examples, an adaptive gate driver uses different sized transistors when controlling a power transistor based on a detection of the overvoltage condition. For example, responsive to not detecting an overvoltage condition, the gate driver can turn on a first transistor having a first size (e.g., a first conduction parameter, a first width-length (W/L) ratio, etc.) corresponding to a first pulldown strength. Accordingly, the gate driver can turn off the power transistor at a first rate using the first transistor based on the first pulldown strength. In other examples, responsive to detecting the overvoltage condition, the gate driver can turn off the first transistor and turn on a second transistor having a second size (e.g., a second conduction parameter, a second W/L ratio, etc.) corresponding to a second pulldown strength, where the second size and the second pulldown strength are less than the first size and the first pulldown strength. Accordingly, the gate driver can turn off the power transistor at a second rate slower than the first rate using the second transistor based on the second pulldown strength.

In some examples, a drive strength of the gate driver (e.g., a drive strength of one or more transistors included in the gate driver) is based on a size of one or more transistors included in the gate driver. For example, a larger-sized transistor can conduct more current than a smaller-sized transistor, which can discharge a gate voltage, a current, etc., associated with a power transistor faster than the smaller-sized transistor and, thus, turn off the power transistor faster than the smaller-sized transistor. In some described examples, the gate driver includes a timer circuit to control the duration of the second transistor to prevent undesirable shoot-through conditions.

Advantageously, by dynamically controlling the pulldown strength of the power transistor, the gate driver can facilitate the reduction of the size and cost of the TVS diode. Accordingly, the adaptive gate driver can facilitate reduced current flow through the TVS diode during overvoltage conditions and, thus, the adaptive gate driver renders improved stable clamping of voltage spikes to improve operation of conventional power delivery systems.

Figure 1B:
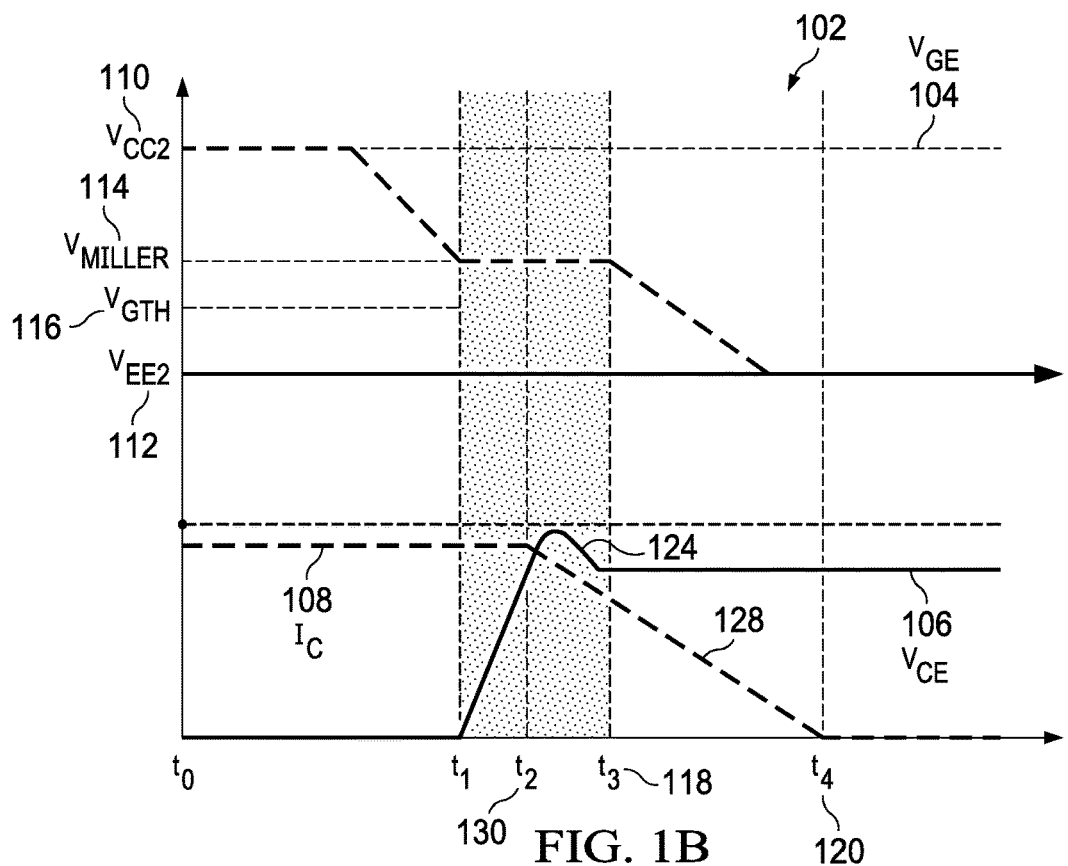
FIG. 1B is a second graph corresponding to a second switching commutation scenario of a transistor being controlled by a gate driver at a second switching speed that is slower than the first switching speed of FIG. 1A.

FIGS. 1A and 1B are graphs 100, 102 corresponding to different switching commutation scenarios of a transistor being controlled by a gate driver. For example, the first graph 100 of FIG. 1A depicts operation of a power IGBT and/or SiC transistor controlled by a gate driver at a first switching speed. The second graph 102 of FIG. 1B depicts operation of the power IGBT and/or SiC transistor controlled by the gate driver at a second switching speed (e.g., a slower switching speed) that is slower than the first switching speed (e.g., a faster switching speed) depicted in FIG. 1A.

In FIGS. 1A-1B, waveforms for a gate-emitter voltage ($V_{GE}$) 104, a collector-emitter voltage ($V_{CE}$) 106, and a collector current ($I_C$) 108 of the power IGBT and/or SiC transistor are depicted. For example, the $V_{GE}$ waveforms 104 in FIGS. 1A-1B are depicted at various voltage levels including a digital circuit high-supply level ($V_{CC2}$) 110, a digital circuit low-supply level ($V_{EE2}$) 112, a Miller voltage ($V_{miller}$) 114, and a gate-threshold voltage ($V_{GTH}$) 116.

In FIG. 1A, the power IGBT and/or SiC transistor operating at the faster switching speed causes $I_C$ 108 to fall to approximately zero current at the third time ($T_3$) 118. In FIG. 1B, the power IGBT and/or SiC transistor operating at the slower switching speed causes the $I_C$ 108 to fall to approximately zero current at the fourth time ($T_4$) 120 after the third time 118 depicted in FIG. 1A. Although the faster switching speed depicted in FIG. 1A reduces switching loss, disadvantageously, the faster switching speed causes a first voltage spike 122 in $V_{CE}$ 106 that is higher than a second voltage spike 124 in $V_{CE}$ 106 caused by the slower switching speed depicted in FIG. 1B. For example, a first change in current over time (e.g., di/dt) 126 in FIG. 1A can cause the first voltage spike 122 of $V_{CE}$ 106 compared to a second di/dt 128 in FIG. 1B that is smaller than the first di/dt 126. In such examples, the voltage spike of $V_{CE}$ 106 depicted in FIG. 1A can cause potential damage to the power IGBT and/or SiC transistor.

In some instances, a larger sized TVS is used in connection with the power IGBT and/or SiC transistor at the faster switching speed in FIG. 1A compared to a smaller sized TVS used in connection with the power IGBT and/or SiC transistor at the slower switching speed in FIG. 1B. For example, the larger sized TVS can be used to protect the power IGBT and/or SiC transistor from the increased $V_{CE}$ 106 voltage spike 122 depicted in FIG. 1A. Accordingly, the faster switching speed operation depicted in FIG. 1A can cause reduced switching loss compared to the slower switching speed operation depicted in FIG. 1B, however, the faster switching speed causes voltage spikes such as the first voltage spike 122 of $V_{CE}$ 106 from a second time ($T_2$) 130 until the third time 118 that can damage the power IGBT and/or SiC transistor.

Advantageously, example gate driver stages described herein can facilitate operation of the power IGBT and/or SiC transistor at the faster switching speed while reducing the first voltage spike 122 of $V_{CE}$ 106 to improve an efficiency of a power delivery system including the power IGBT and/or SiC transistor while preventing damage to the power IGBT and/or SiC transistor.

Figure 2:
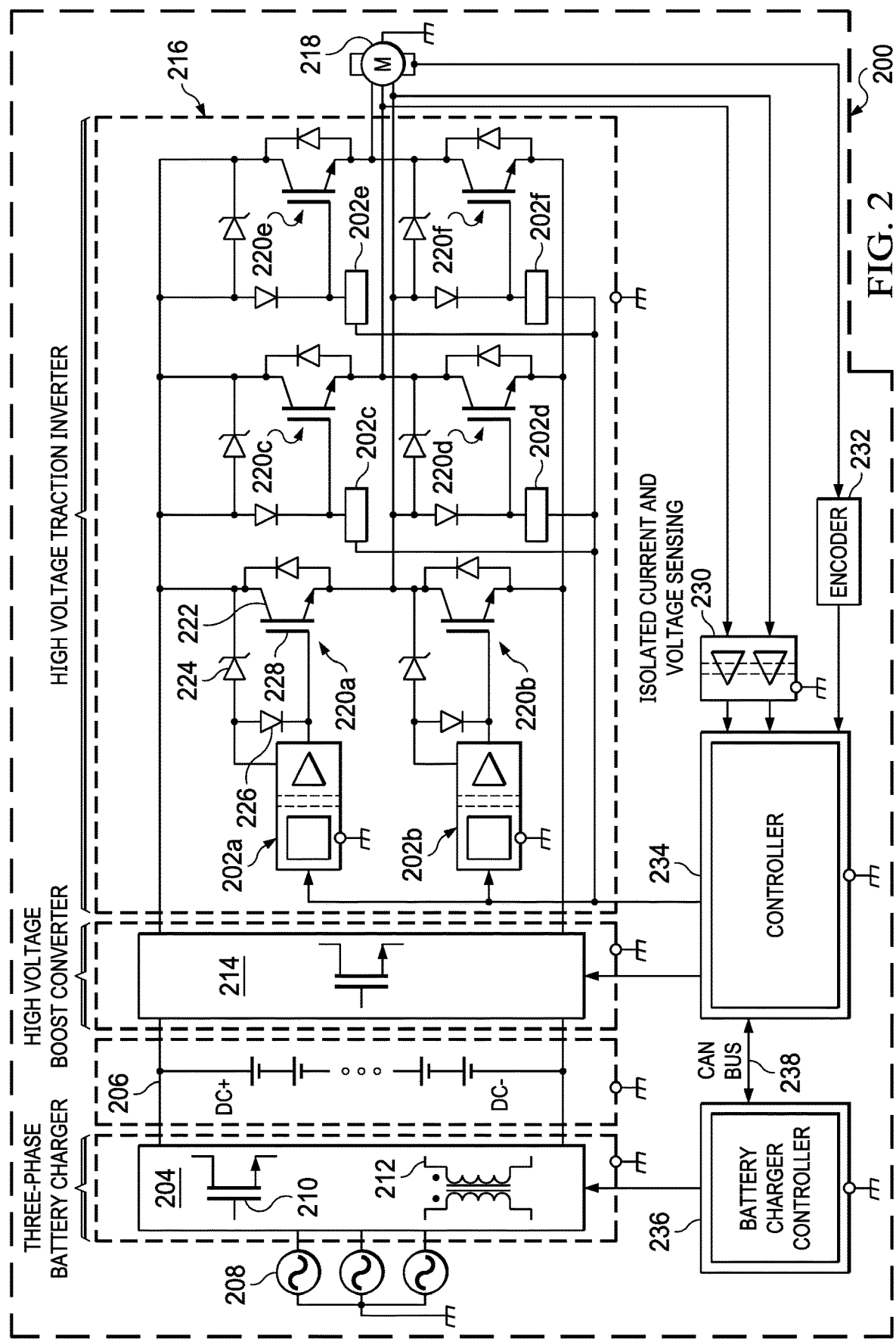
FIG. 2 is a schematic illustration of an example electric or hybrid vehicle high-voltage power electronics system including a gate driver integrated device.

FIG. 2 is a schematic illustration of an example high-voltage power electronics system 200 including example gate driver integrated devices 202a-f. In FIG. 2, the gate driver integrated devices 202a-f include a first example gate driver integrated device 202a, a second example gate driver integrated device 202b, a third example gate driver integrated device 202c, a fourth example gate driver integrated device 202d, a fifth example gate driver integrated device 202e, and a sixth example gate driver integrated device 202f Alternatively, high-voltage power electronics system may include fewer or more than the gate driver integrated devices 202a-f depicted in FIG. 2.

In the example of FIG. 2, the high-voltage power electronics system 200 is a vehicle high-voltage power electronics system included in an electric vehicle or a hybrid vehicle. Alternatively, the high-voltage power electronics system 200 may be used in any other high-voltage application (e.g., a 200 volt (V) power delivery application, a 400 V power delivery application, a 650 V power delivery application, etc.).

In the example of FIG. 2, the high-voltage power electronics system 200 includes an example three-phase battery charger 204 to convert alternating current (AC) power to direct current (DC) power to charge an example battery source 206. In FIG. 2, the three-phase battery charger 204 is a three-phase rectifier that converts AC power from an example mains grid 208 to DC power to charge one or more high-voltage batteries of the battery source 206. Alternatively, the three-phase battery charger 204 may be replaced with a battery charger having two or fewer phases or more than three phases. In FIG. 2, the battery source 206 includes one or more lithium-ion batteries. Alternatively, the battery source 206 may include a different type of battery or a combination of different battery types.

In the example of FIG. 2, the three-phase battery charger 204 is a two-stage architecture. In FIG. 2, the two-stage architecture includes an example first stage 210 corresponding to a front-end power factor correction (PFC) stage and a second example stage 212 corresponding to an isolated DC/DC converter. For example, the first stage 210 can be an active power factor correction circuit including a multi-phase rectifier, a control circuit, and a power transistor. In such examples, the first stage 210 can convert the AC power from the mains grid 208 to DC power. The control circuit can measure the DC input voltage and/or current then adjust a switching time, a duty cycle, etc., to ensure that the DC input voltage and/or current are in phase, reduce switching loss, reduce switching noise, etc., and/or a combination thereof. In other examples, the second stage 212 can be a converter (e.g., a flyback converter, a boost converter, etc.) that facilitates soft switching and to reduce electro-magnetic interference (EMI).

In the example of FIG. 2, the battery source 206 is coupled to an example power converter 214. In FIG. 2, the power converter 214 is a high-voltage boost converter. For example, the power converter 214 can boost the voltage of the battery source 206 to hundreds of volts (e.g., 200 V, 400 V, 600 V, etc.) in examples where the voltage of the battery source 206 is relatively low. Alternatively, the power converter 214 of FIG. 2 may include more than one power converter and/or a different type of power converter (e.g., a buck converter, a buck-boost converter, etc.).

In the example of FIG. 2, the power converter 214 is coupled to an example traction inverter 216. In FIG. 2, the traction inverter 216 is a high-voltage traction inverter that converts DC current from the power converter 214 to AC current to control a rotation of an example motor 218 by generating a rotating magnetic field. In FIG. 2, the motor 218 is a three-phase electric motor. For example, the motor 218 may be a three-phase electric motor included in an electric vehicle, a hybrid vehicle, etc. Alternatively, the motor 218 may be controlled using fewer or more than three phases.

In the example of FIG. 2, the traction inverter 216 includes the gate driver integrated devices 202a-f to facilitate the switching and/or otherwise operation of example SiC transistors 220a-f In FIG. 2, the SiC transistors 220a-f are n-channel SiC transistors. Alternatively, the traction inverter 216 may be implemented using p-channel SiC transistors for the SiC transistors 220a. In FIG. 2, the SiC transistors are SiC IGBTs. Alternatively, one or more of the SiC transistors 220a may be replaced with silicon IGBTs, and/or any other types of SiC transistors and/or IGBTs.

In the example of FIG. 2, the first gate driver integrated device 202a is coupled to a first example SiC transistor 220a, the second gate driver integrated device 202b is coupled to a second example SiC transistor 220b, the third gate driver integrated device 202c is coupled to a third example SiC transistor 220c, the fourth gate driver integrated device 202d is coupled to a fourth example SiC transistor 220d, the fifth gate driver integrated device 202e is coupled to a fifth example SiC transistor 220e, and the sixth gate driver integrated device 202f is coupled to a sixth example SiC transistor 220f Alternatively, there may be fewer or more than the SiC transistors 220a-f depicted in FIG. 2. Alternatively, the traction inverter 216 may be implemented using MOSFETs in place of and/or in addition to the SiC transistors 220a-f.

In the example of FIG. 2, the gate driver integrated devices 202a-f are integrated circuits that monitor a voltage associated with the SiC transistors 220a-f and determines whether the voltage satisfies and/or otherwise meets a threshold (e.g., a voltage threshold, an overvoltage threshold, etc.). In some examples, the first gate driver integrated device 202a can determine that a voltage at an example collector (e.g., a collector terminal, a current terminal, etc.) 222 of the first SiC transistor 220a is indicative of an overvoltage condition of the first SiC transistor 220a responsive to the voltage meeting an overvoltage threshold. In such examples, the first gate driver integrated device 202a can detect the overvoltage condition responsive to the voltage at the collector 222 causing a first example diode 224 to break down and conduct current. For example, the first diode 224 can conduct current responsive to the voltage across the first diode 224 being greater than a breakdown voltage of the first diode 224. In FIG. 2, the first diode 224 is a TVS diode to protect the first SiC transistor 220a from voltage spikes responsive to a switch operation of the first SiC transistor 220a (e.g., turning from off to on, turning from on to off, etc.). Alternatively, the first diode 224 may be any other type of diode. In FIG. 2, the first diode 224 and a second example diode 226 are configured in a clamping circuit to clamp and/or otherwise reduce a collector-emitter voltage ($V_{CE}$) of the first SiC transistor 220a to a voltage (e.g., a clamp voltage) within the SOA of the first SiC transistor 220a.

In the example of FIG. 2, the gate driver integrated devices 202a-f include one or more transistors to turn on or off the SiC transistors 220a-f For example, the first gate driver integrated device 202a can include a first transistor (e.g., a power transistor, an n-channel MOSFET, a p-channel MOSFET, etc.) having a first size and a second transistor having a second size that is less than the first size. For example, the first size can correspond to a first W/L ratio and the second size can correspond to a second W/L ratio, where the first W/L ratio is greater than the second W/L ratio. For example, the first W/L ratio may be two times, three times, six times, etc., larger than the second W/L ratio. Accordingly, the first transistor having the first size can conduct a first current and the second transistor having the second size can conduct a second current, where the first current is greater than the second current. For example, the first transistor can pull down a gate voltage at an example gate (e.g., a gate terminal) 228 of the first SiC transistor 220a stronger than the second transistor. In such examples, the second transistor has a weaker pull down of the gate 228 of the first SiC transistor 220a.

Figure 3:
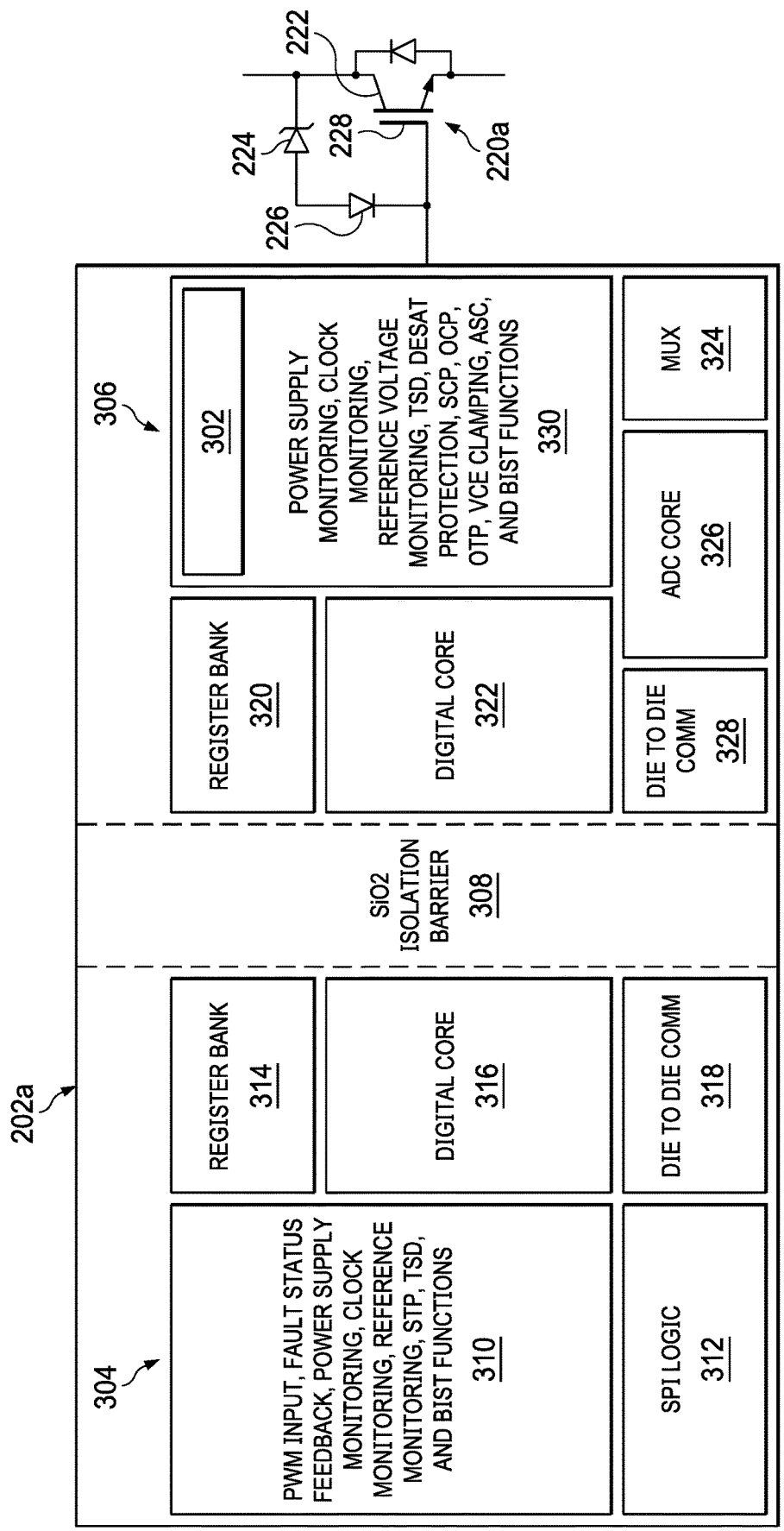
FIG. 3 is a schematic illustration of an example implementation of the gate driver integrated device of FIG. 2 including a gate driver stage.

In the example of FIG. 3, the gate driver integrated devices 202a-f are coupled to a respective gate 228 of the SiC transistors 220a-f In FIG. 2, the first gate driver integrated device 202a is coupled to the gate 228 of the first SiC transistor 220a, the second gate driver integrated device 202b is coupled to the gate 228 of the second SiC transistor 220b, the third gate driver integrated device 202c is coupled to the gate 228 of the third SiC transistor 220c, the fourth gate driver integrated device 202d is coupled to the gate 228 of the fourth SiC transistor 220d, the fifth gate driver integrated device 202e is coupled to the gate 228 of the fifth SiC transistor 220e, and the sixth gate driver integrated device 202f is coupled to the gate 228 of the sixth SiC transistor 220f.

In the example of FIG. 2, the gate driver integrated devices 202a-f can turn off the SiC transistors 220a-f based on whether the overvoltage condition is detected. For example, the first gate driver integrated device 202a can turn on the first transistor responsive to not detecting the overvoltage condition when the first diode 224 does not conduct current. In such examples, the first transistor, when enabled and/or otherwise turned on, can pull down the gate voltage at the gate 228 of the first SiC transistor 220a to turn off the first SiC transistor 220a at a first rate (e.g., a first change in current over time (di/dt)). In other examples, the first gate driver integrated device 202a can turn off the first transistor and turn on the second transistor responsive to detecting the overvoltage condition when the first diode 224 conducts current. In such examples, the second transistor, when enabled and/or otherwise turned on, can pull down the gate voltage at the gate 228 of the first SiC transistor 220a to turn off the first SiC transistor 220a at a second rate (e.g., a second di/dt), where the second rate is slower than the first rate. For example, the first rate can correspond to a first pulldown strength of the first transistor and the second rate can correspond to a second pulldown strength of the second transistor.

Advantageously, the first diode 224 can be reduced in size and monetary cost compared to TVS diodes in conventional traction inverters because the gate driver integrated devices 202a-f can dynamically control the pulldown strength (e.g., the di/dt) of the SiC transistors 220a-f. By dynamically controlling the pulldown strength of the SiC transistors 220a-f, the gate driver integrated devices 202a-f can reduce current flowing through the first diode 224 by reducing amplitudes of voltage spikes during switching operations. Compared to conventional traction inverters where the first diode 224 and/or the second diode 226 may be oversized to compensate for potentially larger voltage spikes and correspondingly larger currents, the traction inverter 216 of FIG. 2 can include smaller TVS diodes because the gate driver integrated devices 202a-f can reduce the voltage spikes from the SiC transistors 220a-f switching operations and reduce the corresponding currents.

In the example of FIG. 2, the high-voltage power electronics system 200 includes example sensing circuitry 230 and an example encoder 232. In FIG. 2, the sensing circuitry 230 performs isolated current and voltage sensing to measure phase currents and phase voltages generated by the traction inverter 216. For example, the sensing circuitry 230 can include one or more current sensors, one or more voltage sensors, etc. In FIG. 2, the encoder 232 is a sensor that measures a speed of the motor 218.

In the example of FIG. 2, the high-voltage power electronics system 200 includes an example controller 234 to perform and/or otherwise facilitate closed-loop control of the speed and torque of the motor 218. For example, the controller 234 can increase or decrease a switching speed of the power converter 214 to increase or decrease a voltage delivered to the motor 218 based on measurements from the sensing circuitry 230 and/or the encoder 232. In other examples, the controller 234 can control a speed and/or torque of the motor 218 based on measurements from the sensing circuitry 230 and/or the encoder 232.

In the example of FIG. 2, the controller 234 can generate and transmits commands, instructions, etc., to an example battery charger controller 236 via an example industrial protocol communication bus 238. In FIG. 2, the battery charger controller 236 controls a conversion of the AC power from the mains grid 208 to DC power based on at least one of a first measurement from the sensing circuitry 230 or a second measurement from the encoder 232. In FIG. 2, the industrial protocol communication bus 238 is a controller area network (CAN) bus that facilitates communication of CAN protocol packets. Alternatively, the controller 234 may control the battery charger controller 236 via any other communication protocol, such as serial peripheral interface (SPI) protocol, Process Field Bus (PROFIBUS) protocol, Modbus protocol, etc.

FIG. 3 is a schematic illustration of an example implementation of the first gate driver integrated device 202a of FIG. 2 including an example gate driver stage 302. Alternatively, the description in connection with FIG. 3 can be applicable to one or more of the second through sixth gate driver integrated devices 202b-f of FIG. 2. In FIG. 3, the first gate driver integrated device 202a is an isolated single channel gate driver integrated circuit including a first example die 304 and a second example die 306, where the first die 304 is separate from the second die 306 via an example isolation barrier 308. Alternatively, the first gate driver integrated device 202a may be implemented using one die or more than two dies. In FIG. 3, the isolation barrier 308 is a silicon dioxide ($SiO_2$) isolation barrier. Alternatively, the isolation barrier 308 may be any other type of isolation barrier. In FIG. 3, the dies 304, 306 are silicon dies. Alternatively, one or both dies 304, 306 may be implemented using different types of dies (e.g., gallium arsenide dies).

In the example of FIG. 3, the gate driver stage 302 is implemented on the second die 306. Alternatively, the gate driver stage 302 may be implemented on the first die 304. Alternatively, the gate driver stage 302 may be implemented on both the first die 304 and the second die 306. Alternatively, in other examples, the gate driver stage 302 and/or any of the components shown in the first gate driver integrated device 202a may be implemented on a plurality of integrated circuits.

In the example of FIG. 3, the first die 304 of the first gate driver integrated device 202a includes first logic circuitry 310 including one or more logic circuits to facilitate pulse-width modulation (PWM) inputs, fault status feedback, power supply monitoring, clock monitoring, reference (voltage) monitoring, shoot-through protection (STP), thermal shutdown (TSD), and built-in self-test (BIST) functions. For example, the first logic circuitry 310 can include a first logic circuit to receive and propagate PWM signals. In other examples, the first logic circuitry 310 can include a second logic circuit to monitor a voltage of a power supply of the first gate driver integrated device 202a, a third logic circuit to monitor a clock signal received by the first gate driver integrated device 202a, etc.

In the example of FIG. 3, the first die 304 of the first gate driver integrated device 202a includes example SPI logic 312, a first example register bank 314, a first example digital core 316, and a first example die to die communication (COMM) circuit 318. In FIG. 3, the first gate driver integrated device 202a includes the SPI logic 312 to facilitate reconfiguration, verification, supervision, and diagnosis of the first gate driver integrated device 202a. For example, the SPI logic 312 can be used to obtain commands to program a setting of the first gate driver integrated device 202a. In FIG. 3, the first gate driver integrated device 202a includes the first register bank 314 to store data. For example, the first register bank 314 can correspond to non-volatile memory (e.g., read-only memory (ROM), electrically erasable programmable read-only memory (EEPROM), flash memory, etc.), volatile memory (e.g., Synchronous Dynamic Random Access Memory (SDRAM), Dynamic Random Access Memory (DRAM), etc. In FIG. 3, the first gate driver integrated device 202a includes the first digital core 316 to provide the handling of startup and shutdown sequences of various blocks or components depicted in the first die 304. The first digital core 316 acts and/or otherwise executes as a communication hub between one or more of the blocks depicted in the first die 304. For example, the SPI logic 312 can interface with the first register bank 314 through the first digital core 316. In FIG. 3, the first gate driver integrated device 202a includes the first die to die communication circuit 318 to facilitate a transmission to and/or a reception of data from the second die 306.

In the example of FIG. 3, the second die 306 of the first gate driver integrated device 202a includes a second example register bank 320, a second example digital core 322, an example multiplexer (MUX) 324, an example analog-to-digital converter (ADC) core 326, and a second die to die communication circuit 328. In FIG. 3, the first gate driver integrated device 202a includes the second register bank 320 to store data. For example, the second register bank 320 can correspond to non-volatile memory, volatile memory, etc. In FIG. 3, the first gate driver integrated device 202a includes the second digital core 322 to provide the handling of startup and shutdown sequences of various blocks or components depicted in the second die 306. The second digital core 322 acts and/or otherwise executes as a communication hub between one or more of the blocks depicted in the second die 306. For example, the die to die communication circuit 328 can interface with the second register bank 320 through the second digital core 322.

In the example of FIG. 3, the first gate driver integrated device 202a includes the multiplexer 324 to switch one of several input lines through to a single common output line by the application of a control signal. For example, the multiplexer 324 may switch one of several analog inputs associated with the first SiC transistor 220a of FIG. 2, such as an emitter current measurement of the first SiC transistor 220a, a gate voltage measurement of the first SiC transistor 220a, etc. In FIG. 3, the first gate driver integrated device 202a includes the analog to digital converter (ADC) core 326 to convert one or more analog signals to one or more digital signals. For example, the ADC core 326 may convert an emitter current, a gate voltage, etc., of the first SiC transistor 220a to a digital representation value (e.g., a binary value, a hex value, a logic zero '0', a logic one '1', etc.). In FIG. 3, the first gate driver integrated device 202a includes the second die to die communication circuit 328 to facilitate a transmission to and/or a reception of data from the first die 304.

In the example of FIG. 3, the second die 306 of the first gate driver integrated device 202a includes second logic circuitry 330 including one or more logic circuits to facilitate power supply monitoring, clock monitoring, reference voltage monitoring, TSD, desaturation (DESAT) protection, short circuit protection (SCP), over current protection (OCP), over temperature protection (OTP), $V_{CE}$ clamping, active short circuit (ASC) support, and BIST functions. For example, the second logic circuitry 330 can include a third logic circuit to implement shunt resistor sensing based OCP and SCP functions. In other examples, the second logic circuitry 330 can include a fourth logic circuit to implement OTP functions by sensing a junction temperature of the first SiC transistor 220a, a fifth logic circuit to monitor a clock signal received by the first gate driver integrated device 202a, etc.

In the example of FIG. 3, the second die 306 of the first gate driver integrated device 202a includes the gate driver stage 302 to facilitate switching operations of the first SiC transistor 220a of FIG. 2. In FIG. 3, the gate driver stage 302 is implemented on the second die 306. Alternatively, the gate driver stage 302 may be implemented on the first die 304. Alternatively, the gate driver stage 302 may be implemented on both the first die 304 and the second die 306. Alternatively, in other examples, the gate driver stage 302 and/or any of the components shown in the first gate driver integrated device 202a may be implemented on a plurality of dies and/or a plurality of integrated circuits.

In the example of FIG. 3, the first gate driver integrated device 202a includes the gate driver stage 302 to monitor a voltage associated with the first SiC transistor 220a and determine whether the voltage satisfies and/or otherwise meets a threshold (e.g., a voltage threshold, an overvoltage threshold, etc.). In some examples, the gate driver stage 302 can determine that a voltage (e.g., a collector voltage) at the collector 222 of the first SiC transistor 220a is indicative of an overvoltage condition of the first SiC transistor 220a responsive to the voltage meeting an overvoltage threshold. In such examples, the gate driver stage 302 can detect the overvoltage condition responsive to the voltage at the collector 222 causing the first diode 224 to break down and conduct current.

In the example of FIG. 3, the gate driver stage 302 turns on or off the first SiC transistor 220a. For example, the gate driver stage 302 can include a first transistor (e.g., a power transistor, an n-channel MOSFET, a p-channel MOSFET, etc.) having a first size and a second transistor having a second size that is less than the first size. For example, the first size can correspond to a first W/L ratio and the second size can correspond to a second W/L ratio, where the first W/L ratio is greater than the second W/L ratio. Accordingly, the first transistor having the first size can conduct a first current and the second transistor having the second size can conduct a second current, where the first current is greater than the second current. For example, the first transistor can pull down a gate voltage at the gate 228 of the first SiC transistor 220a stronger than the second transistor. In such examples, the second transistor has a weaker pull down of the gate 228 of the first SiC transistor 220a.

In the example of FIG. 3, the gate driver stage 302 can turn off the first SiC transistor 220a based on whether the overvoltage condition is detected. For example, the gate driver stage 302 can turn on the first transistor responsive to not detecting the overvoltage condition when the first diode 224 does not conduct current. In such examples, the first transistor, when enabled and/or otherwise turned on, can pull down the gate voltage at the gate 228 of the SiC transistor IGBT 220a to turn off the first SiC transistor 220a at a first rate (e.g., a first change in current over time (di/dt)). In other examples, the gate driver stage 302 can turn off the first transistor and turn on the second transistor responsive to detecting the overvoltage condition when the first diode 224 conducts current. In such examples, the second transistor, when enabled and/or otherwise turned on, can pull down the gate voltage at the gate 228 of the first SiC transistor 220a to turn off the first SiC transistor 220a at a second rate (e.g., a second di/dt), where the second rate is slower than the first rate. For example, the first rate can correspond to a first pulldown strength of the first transistor and the second rate can correspond to a second pulldown strength of the second transistor.

While an example manner of implementing the first gate driver integrated device 202a of FIG. 2 is illustrated in FIG. 3, one or more of the elements, processes, and/or devices illustrated in FIG. 3 may be combined, divided, re-arranged, omitted, eliminated, and/or implemented in any other way. Further, the gate driver stage 302, the first die 304, the second die 306, the first logic circuitry 310, the SPI logic 312, the first register bank 314, the first digital core 316, the first die to die communication 318, the second register bank 320, the second digital core 322, the multiplexer 324, the ADC core 326, the second die to die communication 328, the second logic circuitry 330, and/or, more generally, the first gate driver integrated device 202a of FIG. 2 may be implemented by hardware, software, firmware, and/or any combination of hardware, software, and/or firmware. Thus, for example, any of the gate driver stage 302, the first die 304, the second die 306, the first logic circuitry 310, the SPI logic 312, the first register bank 314, the first digital core 316, the first die to die communication 318, the second register bank 320, the second digital core 322, the multiplexer 324, the ADC core 326, the second die to die communication 328, the second logic circuitry 330, and/or, more generally, the first gate driver integrated device 202a could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the gate driver stage 302, the first die 304, the second die 306, the first logic circuitry 310, the SPI logic 312, the first register bank 314, the first digital core 316, the first die to die communication 318, the second register bank 320, the second digital core 322, the multiplexer 324, the ADC core 326, the second die to die communication 328, and/or the second logic circuitry 330 is/are hereby expressly defined to include a non-transitory computer readable storage device or storage disk such as non-volatile memory (e.g., ROM, EEPROM, flash memory, etc.), volatile memory (e.g., SDRAM, DRAM, etc., and/or any other type of RAM device), etc., including the software and/or firmware. Further still, the first gate driver integrated device 202a of FIG. 2 may include one or more elements, processes, and/or devices in addition to, or instead of, those illustrated in FIG. 3, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 4:
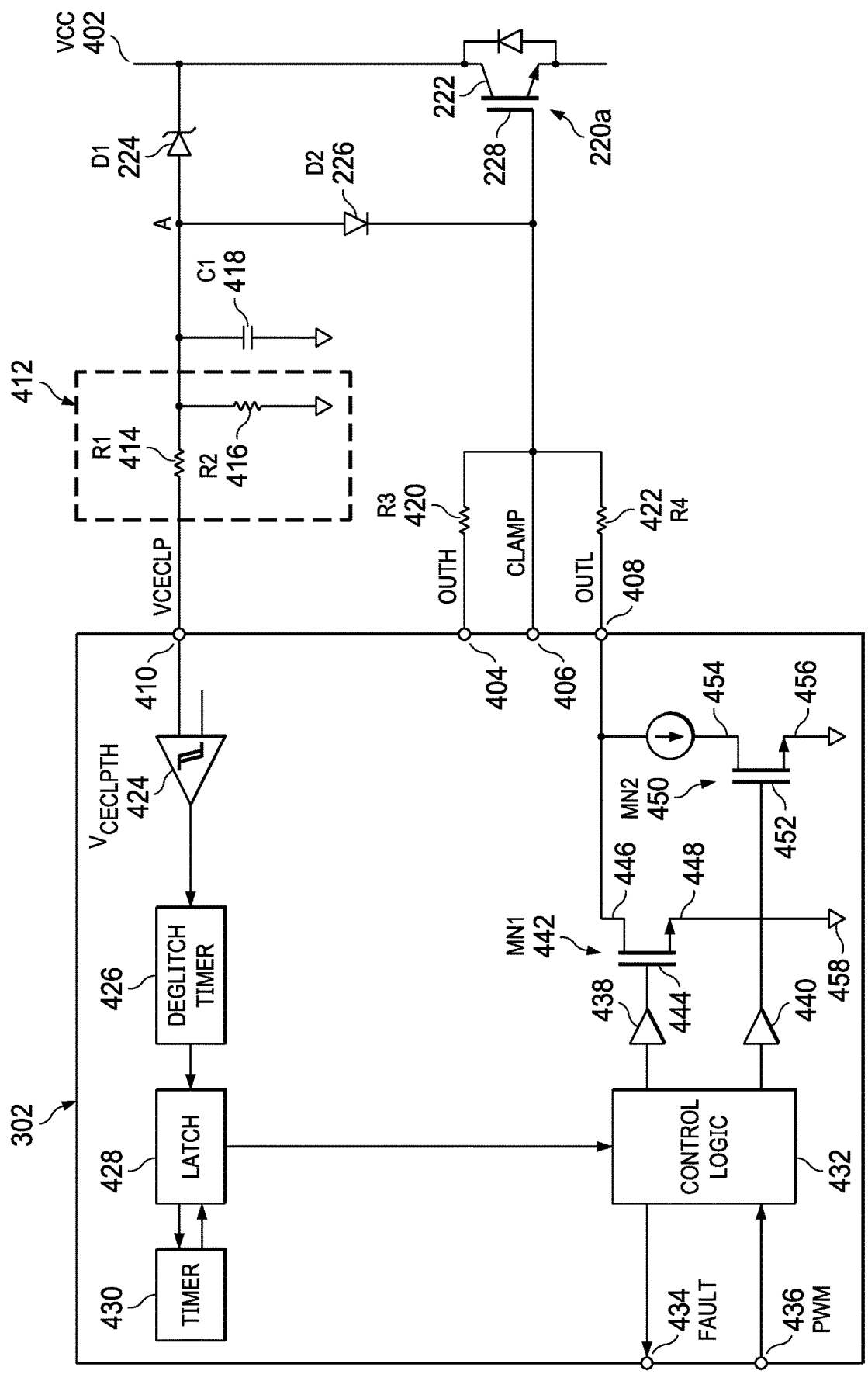
FIG. 4 is a schematic illustration of an example implementation of the gate driver stage of FIG. 3.

FIG. 4 is a schematic illustration of an example implementation of the gate driver stage 302 of FIG. 3. In FIG. 4, the gate driver stage 302 is coupled to the first SiC transistor 220a of FIG. 2. Alternatively, the gate driver stage 302 may be coupled to a different one of the SiC transistors 220a-f of FIG. 2. In FIG. 4, the collector 222 of the first SiC transistor 220a is coupled to an example supply voltage (VCC) 402 and the first cathode of the first diode (D1) 224. The gate 228 of the first SiC transistor 220a is coupled to the second cathode of the second diode (D2) 226.

In the example of FIG. 4, the gate driver stage 302 is coupled to the gate 228 by at least three example integrated circuit (IC) pins 404, 406, 408 including a first example IC pin (OUTH) 404, a second example IC pin (CLAMP) 406, and a third example IC pin (OUTL) 408. In FIG. 4, OUTH 404 is coupled to the gate 228 via a third example resistor (R3) 420. In FIG. 4, OUTL 408 is coupled to the gate 228 via a fourth example resistor (R4) 422.

In the example of FIG. 4, OUTH 404 can correspond to an output high (OUTH) driver (not shown) of the gate driver stage 302 and OUTL 408 can correspond to an output low (OUTL) driver of the gate driver stage 302 that can generate an output by adjusting one or more current paths to charge or discharge the gate 228. For example, the OUTH driver can turn on the first SiC transistor 220a by pulling up the gate voltage of the gate 228 by adjusting one or more current paths to the gate 228. In other examples, the OUTL driver can correspond to the first buffer 438 and MN1 442 to turn off the first SiC transistor 220a by pulling down the gate voltage of the gate 228 by adjusting one or more current paths to the gate 228. In FIG. 4, CLAMP 406 corresponds to an output of a clamp circuit (not shown) of the gate driver stage 302 that can pull down the gate voltage of the gate 228 by adjusting a current path to the gate 228. In such examples, the clamp circuit can turn on one or more transistors to adjust the current path of the gate 228 to reduce the gate voltage of the gate 228 below a threshold voltage of the first SiC transistor 220a.

In the example of FIG. 4, a fourth example IC pin (VCECLP) 410 of the gate driver stage 302 is coupled to an example resistor network 412 including a first example resistor (R1) 414 and a second example resistor (R2) 416. In FIG. 4, the resistor network 412 is coupled to an example capacitor (C1) 418. In FIG. 4, the first resistor 414, the second resistor 416, and the capacitor 418 are coupled to the first anode of the first diode 224 and the second anode of the second diode 226.

In the example of FIG. 4, the gate driver stage 302 includes an example comparator 424, a first example timer circuit 426, an example latch 428, and a second example timer circuit 430, and example control logic 432. In FIG. 4, an output of the comparator 424 is coupled to an input of the first timer circuit 426. Alternatively, in other examples, the output of the comparator 424 is coupled to a first input of the latch 428. In FIG. 4, an output of the first timer circuit 426 is coupled to the first input of the latch 428. In FIG. 4, a first output of the latch 428 is coupled to an input of the second timer circuit 430. In FIG. 4, a second output of the latch 428 is coupled to one or more first inputs of the control logic 432. In FIG. 4, an output of the second timer circuit 430 is coupled to a second input of the latch 428.

In FIG. 4, the comparator 424 is a Schmitt trigger. Alternatively, any other type of comparator may be used. In FIG. 4, the first timer circuit 426 is a deglitch timer circuit that, when enabled by the comparator 424, initiates and/or otherwise triggers a deglitch timer. For example, the deglitch timer can be used to ensure operations of the gate driver stage 302 are executed at sufficiently spaced intervals. Alternatively, the first timer circuit 426 is optional and, accordingly, may not be included in the gate driver stage 302. In FIG. 4, the latch 428 is a set-reset (SR) latch. Alternatively, the latch 428 may be a D-type flip-flop or any other type of latch, flip-flop, etc. In FIG. 4, the second timer circuit 430 is a counter that, when enabled by the latch 428, initiates and/or otherwise triggers a timer. For example, the second timer circuit 430 may be an analog timer with an RC time constant. In other examples, the second timer circuit 430 can be one or more D-type flip-flops in series to count a number of clock edges of a high-speed clock included in and/or otherwise associated with the gate driver integrated devices 202a-f of FIGS. 2-3.

In the example of FIG. 4, the gate driver stage 302 includes example control logic 432. In FIG. 4, the control logic 432 is a logic circuit including one or more logic gates. Alternatively, the control logic 432 may be a controller (e.g., one or more controllers, one or more processors, etc.) executing machine readable instructions or a hardware implemented state machine. In FIG. 4, a third output of the control logic 432 is coupled to an example fault IC pin 434. In FIG. 4, a second input of the control logic 432 is coupled to an example PWM IC pin 436. In FIG. 4, a first output of the control logic 432 is coupled to a first example buffer 438. In FIG. 4, a second output of the control logic 432 is coupled to a second example buffer 440.

In the example of FIG. 4, the first buffer 438 is coupled to a first example transistor (MN1) 442 having a first example gate 444, a first example drain (e.g., a current terminal, a drain terminal, etc.) 446, and a first example source (e.g., a current terminal, a source terminal, etc.) 448. In FIG. 4, the second buffer 440 is coupled to a second example transistor (MN2) 450 having a second example gate 452, a second example drain 454, and a second example source 456.

In the example of FIG. 4, the first transistor 442 is an n-channel MOSFET. Alternatively, the gate driver stage 302 may be implemented using a p-channel MOSFET or any other type of transistor for the first transistor 442. In some examples, the first transistor 442 is a SiC transistor (e.g., a SiC MOSFET). Alternatively, the first transistor 442 may be a silicon transistor (e.g., a silicon MOSFET). The first buffer 438 is coupled to the first gate 444 of the first transistor 442. The first source 448 is coupled to an example ground rail 458. The first drain 446 is coupled to OUTL 408 and, thus, coupled to the gate 228 of the first SiC transistor 220a via the fourth resistor 422. The first drain 446 is coupled to the second drain 454.

In the example of FIG. 4, the second transistor 450 is an n-channel MOSFET. Alternatively, the gate driver stage 302 may be implemented using a p-channel MOSFET or any other type of transistor for the second transistor 450. In some examples, the second transistor 450 is a SiC transistor (e.g., a SiC MOSFET). Alternatively, the second transistor 450 may be a silicon transistor (e.g., a silicon MOSFET). The second buffer 440 is coupled to the second gate 452 of the second transistor 450. The second source 456 is coupled to the ground rail 458. The second drain 454 is coupled to OUTL 408 and, thus, coupled to the gate 228 of the first SiC transistor 220a via the fourth resistor 422.

Figure 5:
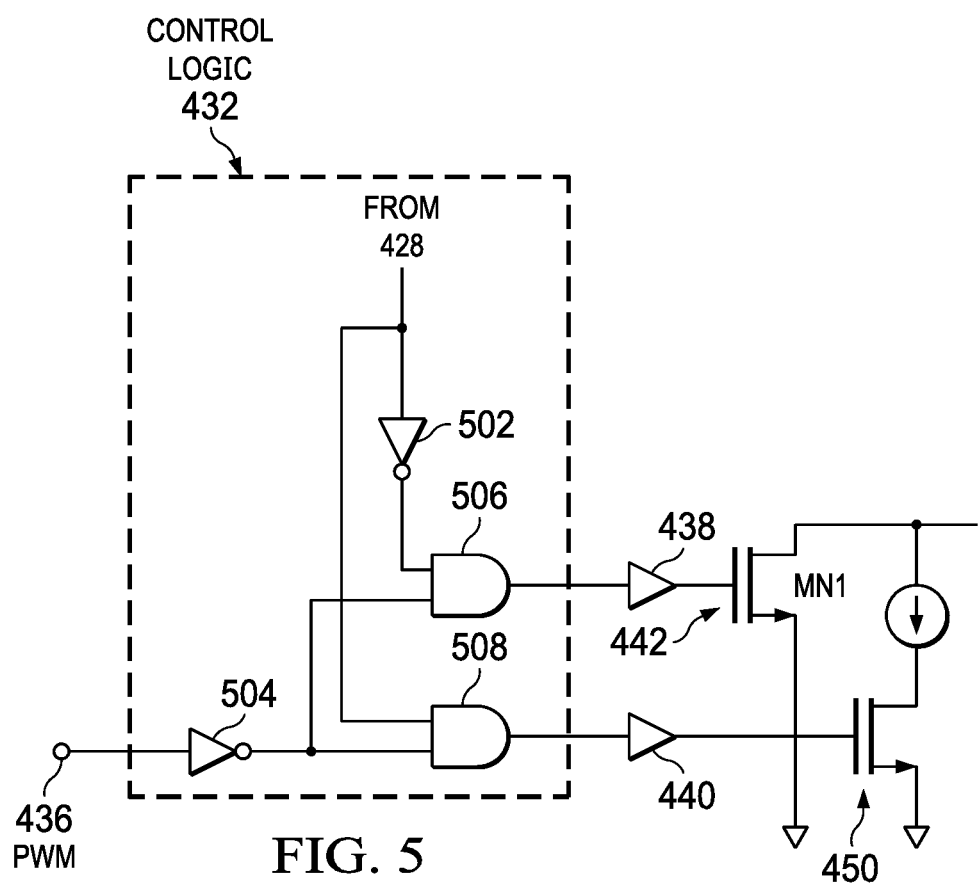
FIG. 5 is a schematic illustration of an example implementation of the control logic of FIG. 4.

Turning to FIG. 5, a schematic illustration of an example implementation of the control logic 432 of FIG. 4 is depicted. In FIG. 5, the control logic 432 is depicted as combinational logic including a first example logic gate 502, a second example logic gate 504, a third example logic gate 506, and a fourth example logic gate 508. Alternatively, fewer or more than the logic gates 502, 504, 506, 508 depicted in FIG. 5 may be used to implement the control logic 432.

In the example of FIG. 5, the first and second logic gates 502, 504 are inverters. In FIG. 5, the third and fourth logic gates 506, 508 are AND gates. The second output of the latch 428 of FIG. 4 is coupled to an input of the first inverter 502 and a first input of the second AND gate 508. An output of the first inverter 502 is coupled to a first input of the first AND gate 506. An input of the second inverter 504 is coupled to the PWM IC pin 436 of FIG. 4. An output of the second inverter 504 is coupled to a second input of the first AND gate 506 and a second input of the second AND gate 508. An output of the first AND gate 506 is coupled to an input of the first buffer 438. An output of the second AND gate 508 is coupled to an input of the second buffer 440.

Turning back to the example of FIG. 4, in operation, the gate driver stage 302 obtains a measurement (e.g., a voltage measurement) at the fourth IC pin 410. The measurement corresponds to and/or otherwise is associated with a voltage at the collector 222 of the first SiC transistor 220a. For example, during an overvoltage condition of the first SiC transistor 220a, a voltage at the collector 222 is greater than a break down voltage of the first diode 224. In such examples, the first diode 224 conducts current. The current flows through the second diode 226 to clamp and/or otherwise maintain the voltage at the collector 222 to a predefined clamp voltage. The current flowing through the first diode 224 causes a voltage to be generated by the resistor network 412. The voltage generated by the resistor network 412 is measured by the gate driver stage 302 at the fourth IC pin 410.

In operation, in a non-overvoltage condition of the first SiC transistor 220a, the first diode 224 is turned off and/or is otherwise not conducting current. During the non-overvoltage condition, the voltage at point A is pulled down to ground (e.g., the ground rail 458) by the second resistor 416. In an overvoltage condition of the first SiC transistor 220a, the first diode 224 operates in the reverse breakdown region and conducts current. During the overvoltage condition, the voltage at point A is pulled up to a voltage corresponding to a sum of (1) the gate voltage of the gate 228 and (2) a forward voltage drop of the second diode 226. The voltage at point A is sensed and/or otherwise measured by the fourth IC pin 410. The voltage at the fourth IC pin 410 is compared by the comparator 424 to a predefined voltage ($V_{CECLPth}$) (e.g., a voltage threshold, a predefined voltage threshold, a threshold, etc.). In some examples, the predefined voltage is half of the gate threshold voltage ($V_{TH}$) of the first SiC transistor 220a. Alternatively, the predefined voltage may be any other voltage.

In operation, the gate driver stage 302 detects an overvoltage condition of the first SiC transistor 220a responsive to the comparator 424 asserting a logic High signal (e.g., a voltage corresponding to a digital one '1'). The comparator 424 asserts a logic High signal responsive to the voltage at the fourth IC pin 410 (e.g., the voltage at point A) satisfying and/or otherwise meeting the predefined voltage. For example, the comparator 424 can assert the logic High signal responsive to the voltage at the fourth IC pin 410 being greater than the predefined voltage. In other examples, the comparator 424 can generate a logic Low signal (e.g., a voltage corresponding to a digital zero '0') responsive to the voltage at the fourth IC pin 410 being less than, not satisfying, not meeting, etc., the predefined voltage.

In some examples, the assertion by the comparator 424 invokes the first timer circuit 426 to begin a first timer. Responsive to the first timer elapsing, the first timer circuit 426 asserts a logic High signal to the latch 428. In other examples, the assertion by the comparator 424 sets and/or otherwise enables the latch 428.

Responsive to the latch 428 being set, the latch 428 invokes the second timer circuit 430 to begin a second timer and invokes the control logic 432 to facilitate operation of at least one of the first or second transistors 442, 450. For example, responsive to the latch 428 being set, the latch 428 can assert a logic High signal to the first inverter 502 of FIG. 5 and the second AND gate 508 of FIG. 5. When the PWM signal at the PWM IC pin 436 is a logic Low signal and/or otherwise disabled, the second inverter 504 asserts a logic High signal to the first and second AND gates 506, 508. Responsive to the first inverter 502 generating a logic Low signal (e.g., responsive to the latch 428 asserting a logic High signal), the first AND gate 506 generates a logic Low signal to the first buffer 438 that turns off the first transistor 442. Responsive to the latch 428 asserting a logic High signal and the second inverter 504 asserting a logic High signal (e.g., responsive to the PWM signal at the PWM IC pin 436 being a logic Low signal), the second AND gate 508 generates a logic High signal to the second buffer 440 that turns on the second transistor 450.

In operation, after the second timer triggered by the second timer circuit 430 elapses and/or otherwise ends, the second timer circuit 430 asserts a logic High signal to the latch 428 to reset the latch 428. Responsive to the latch 428 being reset, the latch 428 can deassert the logic High signal by generating a logic Low signal to cause the control logic 432 to turn on the first transistor 442 and turn off the second transistor 450. Accordingly, the control logic 432 ensures that the first transistor 442 and the second transistor 450 are not turned on at the same time to avoid a shoot-through condition. By alternating between the first and second transistors 442, 450 based on a detection of the overvoltage condition of the first SiC transistor 220a, the gate driver stage 302 can adaptively control a pulldown strength of the gate driver stage 302.

In operation, during a non-overvoltage condition of the first SiC transistor 220a, the control logic 432 and/or, more generally, the gate driver stage 302 can turn off the first SiC transistor 220a using the first transistor 442, which has a stronger pulldown strength compared to the second transistor 450. For example, the first transistor 442 having the first W/L ratio can facilitate a greater quantity of current through the first transistor 442 compared to the second transistor 450 having the second W/L ratio, where the first W/L ratio is greater than the second W/L ratio. Accordingly, the control logic 432 and/or, more generally, the gate driver stage 302 can turn off the first SiC transistor 220a at a first rate by operating the first transistor 442.

In operation, during an overvoltage condition of the first SiC transistor 220a, the control logic 432 and/or, more generally, the gate driver stage 302 can turn off the first SiC transistor 220a using the second transistor 450, which has a weaker pulldown strength compared to the first transistor 442. For example, the second transistor 450 having the second W/L ratio can facilitate a smaller quantity of current through the second transistor 450 compared to the first transistor 442 having the first W/L ratio, where the first W/L ratio is greater than the second W/L ratio. Accordingly, the control logic 432 and/or, more generally, the gate driver stage 302 can turn off the first SiC transistor 220a at a second rate by operating the second transistor 450, where the second rate is slower than the first rate.

Advantageously, the gate driver stage 302 can adaptively control the first SiC transistor 220a by turning on the first transistor 442 and turning off the second transistor 450 during a non-overvoltage condition to turn off the SiC transistor IGBT 220a at the first rate and by turning off the first transistor 442 and turning on the second transistor 450 during an overvoltage condition to turn off the SiC transistor IGBT 220a at the second rate. By adaptively controlling the pulldown strength of the gate driver stage 302, the gate driver stage 302 can reduce current flowing through the first diode 224 and, thus, reduce the power dissipation of the first diode 224. Accordingly, the gate driver stage 302 can allow a smaller and more cost-effective TVS diode, such as the first diode 224, compared to conventional gate drivers.

Figure 6:
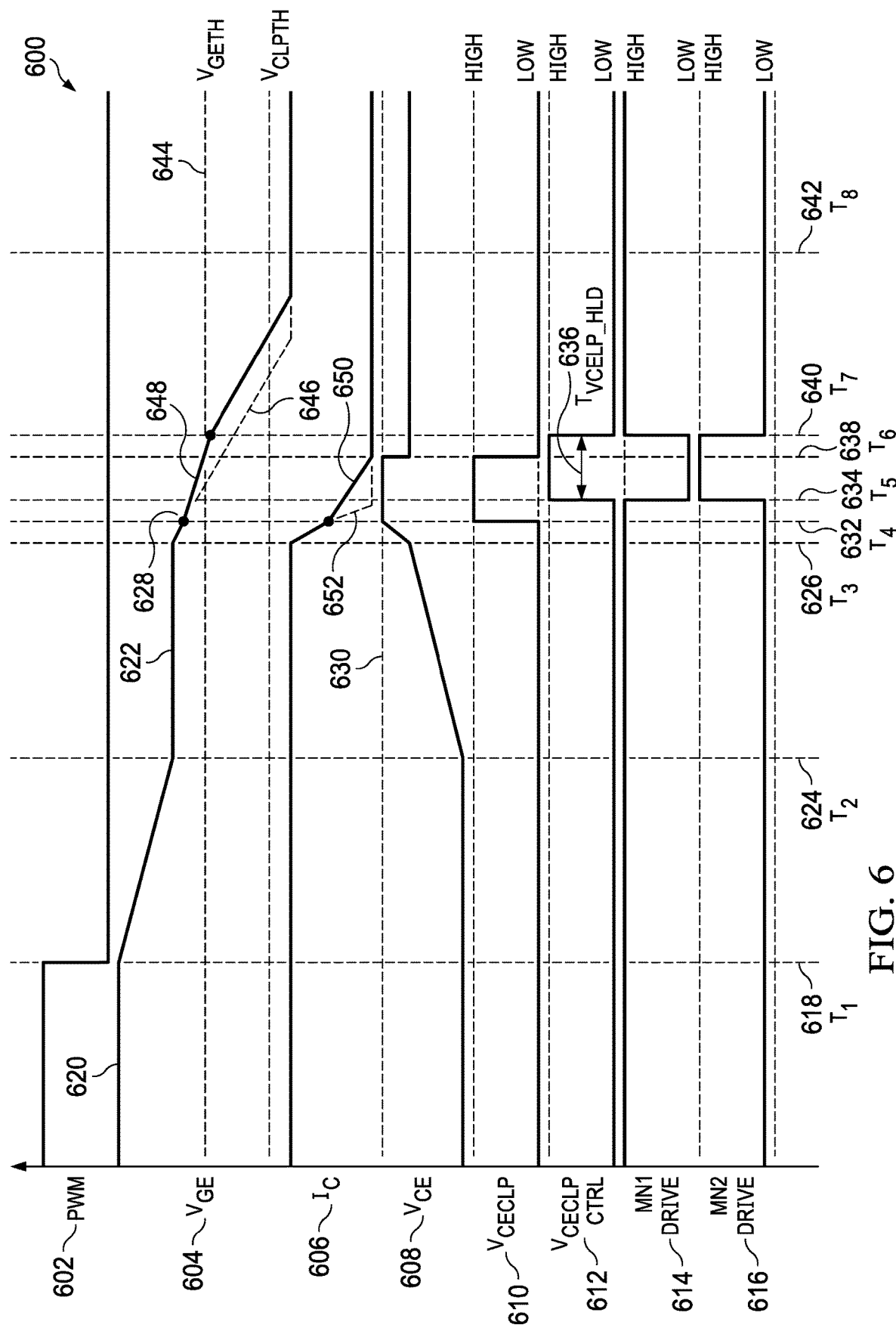
FIG. 6 is an example timing diagram corresponding to operation of the gate driver stage of FIGS. 3-4 and a corresponding one of the transistors of FIG. 2.

FIG. 6 is an example timing diagram 600 corresponding to operation of the gate driver stage 302 of FIGS. 3-4 and a corresponding one of the SiC transistors 220a-f of FIG. 2. The timing diagram 600 depicts example waveforms for an example PWM signal 602, an example gate-emitter voltage ($V_{GE}$) 604, an example collector current ($I_C$) 606, an example collector-emitter voltage ($V_{CE}$) 608, an example collector-emitter clamp voltage (VCECLP) 610, an example collector-emitter clamp voltage control signal (VCECLP CTRL) 612, a first example transistor drive signal (MN1 DRIVE) 614, and a second example transistor drive signal (MN2 DRIVE) 616.

In the timing diagram 600 of FIG. 6, the PWM signal 602 can correspond to a PWM signal received at the PWM IC pin 436 of FIG. 4. $V_{GE}$ 604 can correspond to $V_{GE}$ of the first SiC transistor 220a of FIG. 4. $I_C$ 606 can correspond to $I_C$ of the first SiC transistor 220a of FIG. 4. VCECLP 610 can correspond to an output of the comparator 424 of FIG. 4. VCECLP CTRL 612 can correspond to an output of the latch 428 of FIG. 4 to the control logic 432 of FIG. 4. MN1 DRIVE 614 can correspond to an output of at least one of (1) the control logic 432 of FIG. 4 to the first buffer 438 or (2) an output of the first buffer 438 to the first transistor 442 of FIG. 4. MN2 DRIVE 616 can correspond to an output of at least one of (1) the control logic 432 of FIG. 4 to the second buffer 440 or (2) an output of the second buffer 440 to the second transistor 450 of FIG. 4.

At a first example time ($T_1$) 618, the PWM signal 602 transitions from a logic High signal to a logic Low signal. Responsive to the logic Low signal, the control logic 432 turns on the first transistor 442. Responsive to turning on the first transistor 442, the first transistor 442 begins to pulldown $V_{GE}$ from a first voltage level 620 to a second voltage level 622 indicative of turning off the first SiC transistor 220a.

At a second example time ($T_2$) 624, $V_{CE}$ 608 begins to increase responsive to $V_{GE}$ 604 approaching the second voltage level 622. At a third example time ($T_3$) 626, $V_{GE}$ 604 begins to decrease from the second voltage level 622 to a third voltage level 628. At the third time 626, $I_C$ 606 begins to decrease and $V_{CE}$ 608 begins to increase to an example voltage threshold 630, which can correspond to the breakdown voltage of the first diode 224 of FIG. 2. For example, the voltage threshold 630 can correspond to $V_{CECLPth}$ depicted in FIG. 4.

At a fourth example time ($T_4$) 632, $V_{CE}$ 608 increases to the voltage threshold 630. At the fourth time 632, the first diode 224 breaks down and conducts current. In some examples, at the fourth time 632, the comparator 424 asserts a logic High signal to the first timer circuit 426. In other examples, at the fourth time 632, the comparator 424 asserts a logic High signal (e.g., VCECLP 610) to the latch 428.

At a fifth example time ($T_5$) 634, the latch 428 asserts a logic High signal to trigger the second timer circuit 430 to begin an example timer ($t_{VCECLP\_HLD}$) 636. At the fifth time 634, the latch 428 asserts a logic High signal (e.g., VCECLP CTRL 612) to the control logic 432. At the fifth time 634, responsive to the latch 428 asserting a logic High signal for VCECLP CTRL 612, the control logic 432 generates a logic Low signal for MN1 DRIVE 614 to turn off the first transistor 442 of FIG. 4 depicted in FIG. 6 by transitioning from a HIGH state to a LOW state. At the fifth time 634, responsive to the latch 428 asserting a logic High signal for VCECLP CTRL 612, the control logic 432 asserts a logic High signal for MN2 DRIVE 616 to turn on the second transistor 450 of FIG. 4 depicted in FIG. 6 by transitioning from the LOW state to the HIGH state.

At a sixth example time ($T_6$) 638, $V_{CE}$ 608 decreases below the voltage threshold 630. At the sixth time 638, the first diode 224 is not breaking down and conducting current. In some examples, at the sixth time 638, the comparator 424 generates a logic Low signal to the first timer circuit 426. In other examples, at the sixth time 638, the comparator 424 generates a logic Low signal (e.g., VCECLP 610) to the latch 428.

At a seventh example time ($T_7$) 640, the second timer circuit 430 determines that the timer triggered at the fifth time 634 has elapsed. In FIG. 6, the timer $t_{VCECL\_PHLD}$ 636 corresponds to a time duration beginning at the fifth time 634 and ending at the seventh time 640. At the seventh time 640, the second timer circuit 430 asserts a logic High signal to the latch 428 to reset the latch 428. Responsive to being reset, the latch 428 generates and transmits a logic Low signal (e.g., VCECLP CTRL 612) to the control logic 432.

At the seventh time 640, responsive to the latch 428 generating a logic Low signal for VCECLP CTRL 612, the control logic 432 asserts a logic High signal for MN1 DRIVE 614 to turn on the first transistor 442. At the seventh time 640, responsive to the latch 428 generating a logic Low signal for VCECLP CTRL 612, the control logic 432 generates a logic Low signal for MN2 DRIVE 616 to turn off the second transistor 450. At an eighth example time ($T_8$) 642, the first SiC transistor 220a of FIG. 2 is off. For example, the gate driver stage 302 can turn off the first SiC transistor 220a by causing $V_{GE}$ 604 to fall below an example $V_{GEth}$ threshold 644.

Advantageously, by adaptively changing the pulldown strength of the gate driver stage 302, the gate driver stage 302 affects a rate at which the first SiC transistor 220a transitions from on to off. For example, if the gate driver stage 302 maintained the first transistor 442 in the on state from the fifth time 634 to the seventh time 640, the gate driver stage 302 turns off the first SiC transistor 220a at a first rate depicted by a first example slope 646 of $V_{GE}$ 604 in FIG. 6. In FIG. 6, the first slope 646 corresponds to the waveform of $V_{GE}$ 604 from the fourth time 632 to the seventh time 640. By adaptively changing the pulldown strength by turning off the first transistor 442 and turning on the second transistor 450, which has a weaker pulldown strength compared to the first transistor 442, the gate driver stage 302 turns off the first SiC transistor 220a at a second rate depicted by a second example slope 648 of $V_{GE}$ 604 in FIG. 6. In FIG. 6, the second slope 648 corresponds to the waveform of $V_{GE}$ 604 from the fourth time 632 to the seventh time 640. Accordingly, the change in turn off rate causes a change in $I_C$ 606. For example, by turning off the first SiC transistor 220a at the first rate, a first example di/dt 650 of $I_C$ 606 is less than a second example di/dt 652 of $I_C$ 606 responsive to being turned off at the second rate. In FIG. 6, the first slope 646 corresponds to the first di/dt 650 and the second slope 648 corresponds to the second di/dt 652.

Advantageously, by reducing the change in current over time from the first di/dt 650 to the second di/dt 652 responsive to $V_{CE}$ 608 meeting the voltage threshold 630 indicative of an overvoltage condition of the first SiC transistor 220a, magnitudes of voltage spikes generated by switching events of the first SiC transistor 220a can be reduced and, thus, a reduced size for at least one of the first diode 224 or the second diode 226 can be used.

Figure 7:
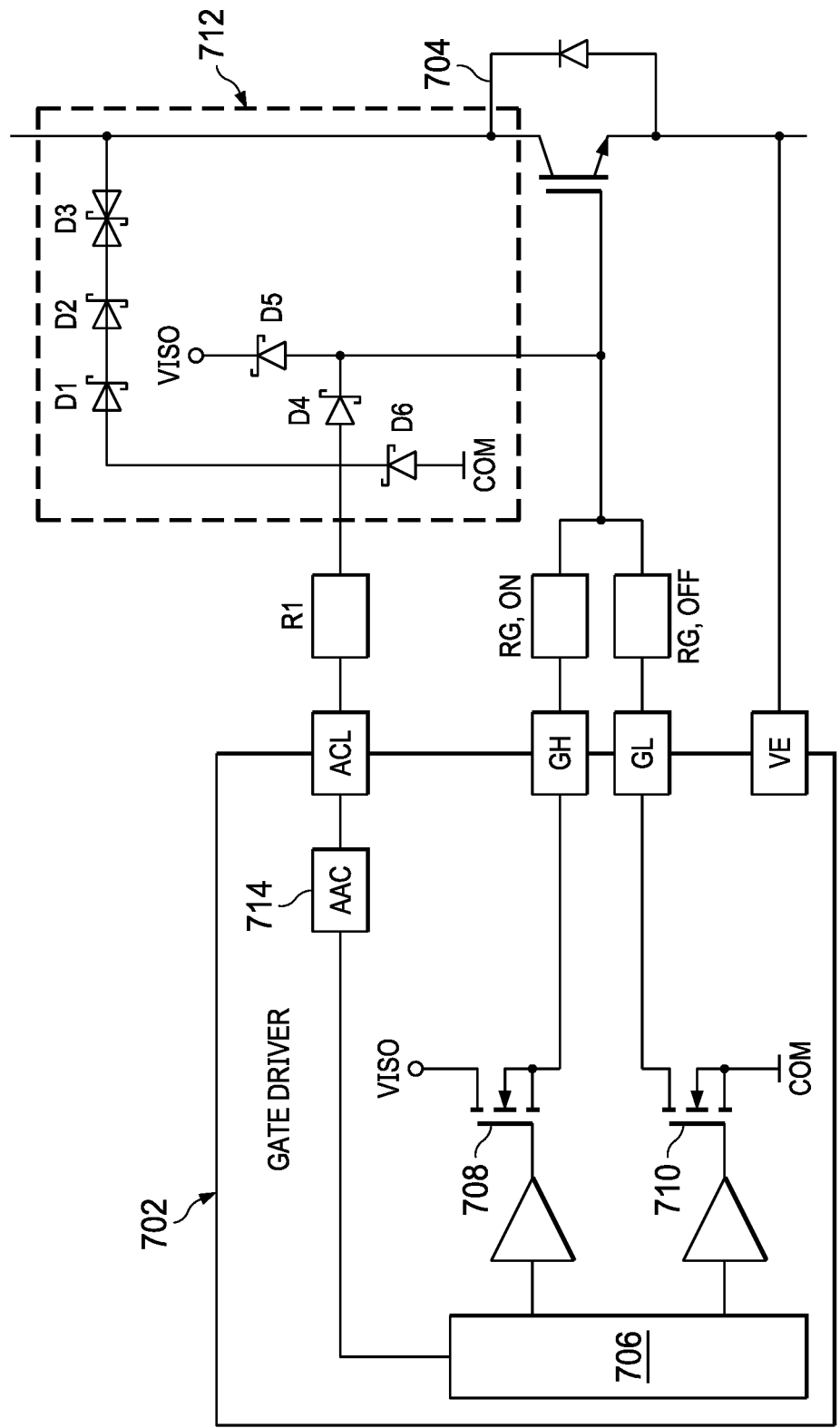
FIG. 7 is a schematic illustration of a gate driver.

FIG. 7 is a schematic illustration of a gate driver 702 coupled to a SiC transistor 704. The gate driver 702 includes a controller 706, a first MOSFET 708, and a second MOSFET 710. In FIG. 7, the first MOSFET 708 is a high-side MOSFET and the second MOSFET 710 is a low-side MOSFET. In operation, the controller 706 turns on the SiC transistor 704 by turning on the first MOSFET 708 and pulling up a gate voltage of a gate of the SiC transistor 704 to a supply voltage (VISO). The controller 706 turns off the SiC transistor 704 by turning on the second MOSFET 710 and pulling down the gate voltage of the gate of the SiC transistor 704 to a ground rail (COM). In FIG. 7, the SiC transistor 704 is a SiC IGBT. Alternatively, the SiC transistor 704 may be replaced with a silicon IGBT, and/or any other type of SiC transistor and/or IGBT.

In FIG. 7, the gate driver 702 and the SiC transistor 704 are coupled to a clamping network 712. The clamping network 712 includes diodes D1-D6. The clamping network 712 is used to mitigate voltage spikes generated by a switching event of the SiC transistor 704. The controller 706 detects an overvoltage condition by obtaining a voltage measurement from an advanced active clamping (AAC) circuit 714 and determining whether the voltage measurement satisfies an overvoltage threshold. However, the controller 706 of FIG. 7 does not adjust a drive strength of the gate driver 702 responsive to the one or more diodes of the clamping network 712 breaking down and conducting current. For example, the controller 706 may generate an alert or adjust a flag bit in a register, but operation of the first MOSFET 708 and/or the second MOSFET 710 are not affected by the detection of the overvoltage condition.

Advantageously, the gate driver stage 302 of FIG. 3 improves the gate driver 702 of FIG. 7 by including the second transistor 450 of FIG. 4 to provide adaptive drive strength control responsive to detection of an overvoltage condition of the SiC transistors 220a-f of FIG. 2. Advantageously, the gate driver stage 302 improves the gate driver 702 of FIG. 7 by including at least one of the first timer circuit 426 or the second timer circuit 430. For example, by including the second timer circuit 430, the gate driver stage 302 can provide a time-out function based on the timer 636 of FIG. 6 to prevent a shoot-through condition associated with the transistors 442, 450 of the gate driver stage 302.

Figure 8:
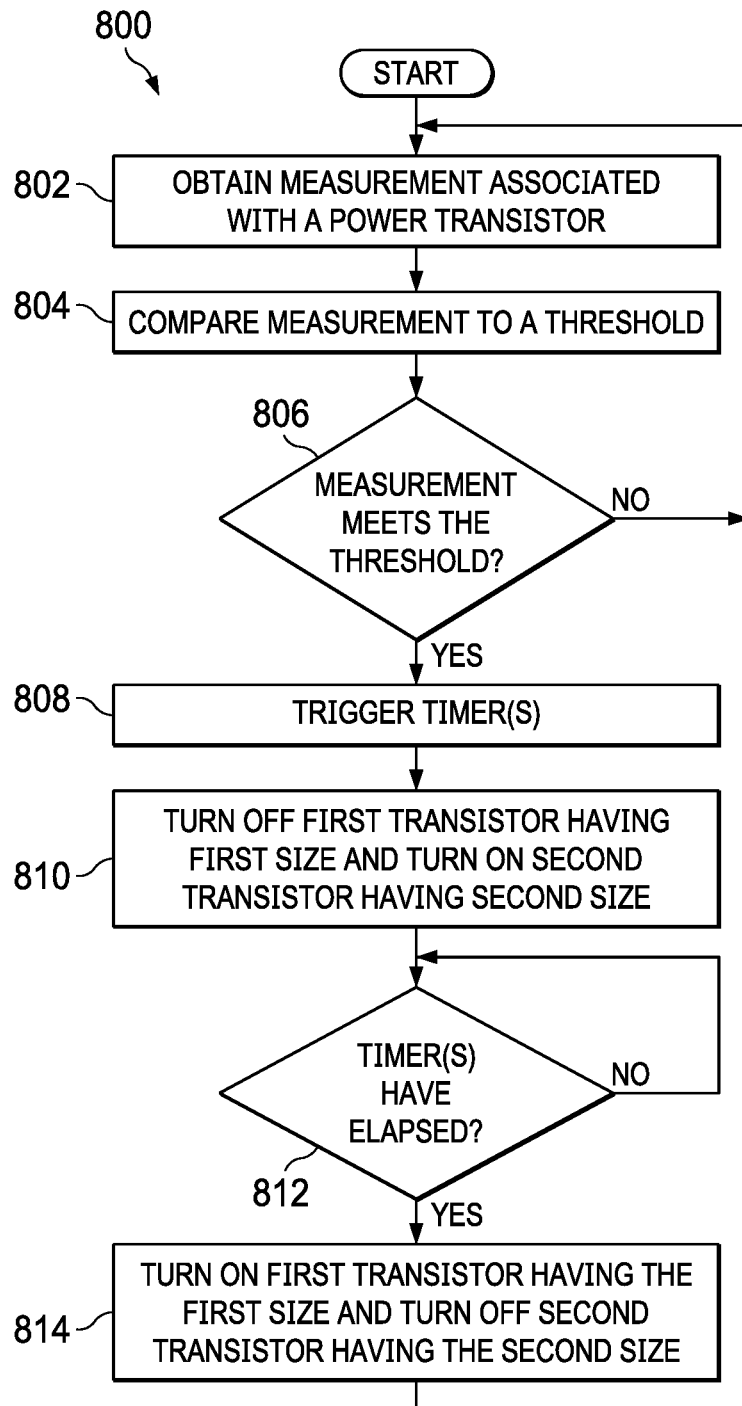
FIG. 8 is a flowchart representative of an example process that may be implemented using hardware or machine readable instructions that may be executed to implement the gate driver stage of FIGS. 3-4.

A flowchart representative of example hardware logic, machine readable instructions, hardware implemented state machines, and/or any combination thereof for implementing the gate driver stage 302 of FIGS. 3-4 is shown in FIG. 8. The machine readable instructions may be an executable program or portion of an executable program for execution by the gate driver stage 302. The program may be embodied in software stored on a non-transitory computer readable storage medium such as non-volatile memory, volatile memory, etc., associated with the gate driver stage 302, but the entire program and/or parts thereof could alternatively be executed by a device other than the gate driver stage 302 and/or embodied in firmware or dedicated hardware. Further, although the example program is described with reference to the flowchart illustrated in FIG. 8, many other methods of implementing the example gate driver stage 302 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example process of FIG. 8 may be implemented using executable instructions (e.g., computer and/or machine readable instructions) stored on a non-transitory computer and/or machine readable medium such as a hard disk drive, a flash memory, a read-only memory, a cache, a random-access memory, and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

FIG. 8 is a flowchart representative of an example process 800 that may be implemented using hardware or machine readable instructions that may be executed to implement the gate driver stage 302 of FIGS. 3-4. For example, the process 800 may be implemented using hardware logic, one or more hardware implemented state machines, one or more processors executing machine readable instructions, etc., and/or a combination thereof. The process 800 of FIG. 8 begins at block 802, at which the gate driver stage 302 obtains a measurement associated with a power transistor. For example, the comparator 424 (FIG. 4) may obtain VCECLP 610 of FIG. 6 at the fourth IC pin 410. In such examples, VCECLP 610 can correspond to a voltage at the collector 222 of the first SiC transistor 220a of FIG. 2. Responsive to obtaining VCECLP 610, the comparator 424 and/or, more generally, the gate driver stage 302 can determine that the first diode 224 of FIG. 2 is conducting current indicative of an overcurrent condition of the first SiC transistor 220a. At block 804, the gate driver stage 302 compares the measurement to a threshold. For example, the comparator 424 may compare VCECLP 610 to the voltage threshold 630 (e.g., $V_{CECLPth}$ of FIG. 4) of FIG. 6.

At block 806, the gate driver stage 302 determines whether the measurement meets the threshold. For example, the comparator 424 may assert a logic High signal responsive to VCECLP 610 being greater than and/or otherwise meeting the voltage threshold 630. In other examples, the comparator 424 can generate a logic Low signal responsive to VCECLP 610 being less than and/or otherwise not meeting the voltage threshold 630.

If, at block 806, the gate driver stage 302 determines that measurement does not meet the threshold, control returns to block 802 to obtain another measurement associated with the power transistor. If, at block 806, the gate driver stage 302 determines that measurement meets the threshold, then, at block 808, the gate driver stage 302 triggers timer(s). For example, the comparator 424 may assert a logic High signal and transmit the logic High signal to the first timer circuit 426 (FIG. 4) to invoke the first timer circuit 426 to trigger a first timer (e.g., a deglitch timer). In other examples, the comparator 424 can assert a logic High signal and transmit the logic High signal to the latch 428 (FIG. 4) to invoke the second timer circuit 430 (FIG. 4) to begin a second timer (e.g., the timer $t_{VCECL\_PHLD}$ 636) of FIG. 6.

At block 810, the gate driver stage 302 turns off a first transistor having a first size and turns on a second transistor having a second size. For example, responsive to the latch 428 being set, the latch 428 asserts a logic High signal to the control logic 432 (FIG. 4) to (1) turn off the first transistor 442 (FIG. 4) having a first size and (2) turn on the second transistor 450 (FIG. 4) having a second size that is less than the first size. In such examples, the first transistor 442 can be two times, six times, etc., greater than the second transistor 450 and, thus, the first transistor 442 can have a greater pulldown strength than the second transistor 450.

At block 812, the gate driver stage 302 determines whether the timer(s) have elapsed. For example, the second timer circuit 430 can determine whether the time duration from the fifth time 634 to the seventh time 640 of FIG. 6 corresponding to $t_{VCECLP\_HLD}$ 636 has elapsed. In such examples, the second timer circuit 430 does not reset the latch 428 until the timer has elapsed to prevent a shoot-through condition associated with the first transistor 442 and the second transistor 450.

If, at block 812, the gate driver stage 302 determines that the timer(s) have not elapsed, control waits at block 812. If, at block 812, the gate driver stage 302 determines that the timer(s) have elapsed, then, at block 814, the gate driver stage 302 turns on the first transistor having the first size and turns off the second transistor having the second size. For example, responsive to the timer of the second timer circuit 430 elapsing, the second timer circuit 430 can reset the latch 428. Responsive to the latch 428 being reset, the latch 428 deasserts the logic High signal and generates a logic Low signal to the control logic 432 to (1) turn on the first transistor 442 having the first size and (2) turn off the second transistor 450 having the second size. In such examples, the gate driver stage 302 can adaptively alter and/or otherwise adjust a driver strength of the gate driver stage 302 responsive to a detection of an overcurrent condition of the first SiC transistor 220a. Responsive to turning on the first transistor having the first size and turning off the second transistor having the second size, the process 800 of FIG. 8 returns to block 802 to obtain another measurement associated with the power transistor.

In this description, example adaptive gate drivers and related methods, apparatus, systems, and articles of manufacture achieve lower switching loss of a power transistor while operating the power transistor in the SOA region. Described adaptive gate drivers output a high drive strength to reduce switching loss when a voltage spike associated with a switching operation does not cause one or more diodes to break down and conduct current. Described adaptive gate drivers output a reduced drive strength to limit the voltage spike when it becomes excessive responsive to the one or more diodes breaking down and conducting current. Advantageously, by adaptively adjusting a driver strength responsive to detection of an overcurrent condition, voltage spikes associated with switching operations of power transistors can be reduced and, thus, limit damage to the power transistors, allow for reduced sizes of diodes to be used, and to improve an efficiency of the power transistors in delivering current to a load.

Example methods, apparatus, systems, and articles of manufacture for adaptive gate drivers are described herein. Further examples and combinations thereof include the following:

Example 1 includes a gate driver system comprising a comparator having a output, a latch having a first input, a second input, a first output, and a second output, the first input of the latch coupled to the output of the comparator, a timer having an input and an output, the input of the timer coupled to the first output of the latch, the output of the timer coupled to the second input of the latch, control logic having an input, a first output, and a second output, the input of the control logic coupled to the second output of the latch, a first transistor having a gate, a second transistor having a gate, a first buffer having an input and an output, the input of the first buffer coupled to the first output of the control logic, the output of the first buffer coupled to the gate of the first transistor, and a second buffer having an input and an output, the input of the first buffer coupled to the second output of the control logic, the output of the second buffer coupled to the gate of the second transistor.

Example 2 includes the gate driver system of example 1, wherein the first transistor is a first n-channel metal-oxide-semiconductor field-effect transistor (MOSFET) having a first size, and the second transistor is a n-channel MOSFET having a second size less than the first size.

Example 3 includes the gate driver system of example 1, wherein the first transistor has a current terminal, and the second transistor has a current terminal, and further including an n-channel insulated-gate bipolar transistor coupled to the current terminal of the first transistor and the current terminal of the second transistor.

Example 4 includes the gate driver system of example 1, wherein the comparator is a Schmitt trigger.

Example 5 includes the gate driver system of example 1, further including a resistor network coupled to an input of the comparator, a capacitor coupled to the resistor network, a first diode having a first anode and a first cathode, the first anode coupled to the resistor network and the capacitor, and a second diode having a second anode and a second cathode, the second anode coupled to the resistor network, the capacitor, and the first anode.

Example 6 includes the gate driver system of example 5, further including an re-channel insulated-gate bipolar transistor having a current terminal and a gate, the current terminal coupled to the first cathode, the gate coupled to the second cathode, the first transistor and the second transistor.

Example 7 includes the gate driver system of example 1, wherein the control logic includes a first inverter having an input and an output, the input coupled to the second output of the latch, a second inverter having an output, a first AND gate having a first input, a second input, and an output, the first input of the first AND gate coupled to the output of the first inverter, the second input of the first AND gate coupled to the output of the second inverter, the output of the first AND gate being the first output of the control logic, the output of the first AND gate coupled to the input of the first buffer, and a second AND gate having a first input, a second input, and an output, the first input of the second AND gate coupled to the second output of the latch, the second input of the second AND gate coupled to the output of the second inverter, the output of the second AND gate being the second output of the control logic, the output of the second AND gate coupled to the input of the second buffer.

Example 8 includes a gate driver comprising a comparator to compare a first voltage to a threshold, the first voltage being scaled from a second voltage at an anode of a diode, the second voltage to be generated responsive to a third voltage at a cathode of the diode being greater than a breakdown voltage of the diode, the cathode coupled to a current terminal of a transistor, and assert a first signal responsive to the first voltage meeting the threshold, a latch coupled to the comparator, the latch is configured to assert a second signal responsive to the first signal being asserted, a first transistor having a first size, a second transistor having a second size less than the first size, and control logic coupled to the latch, the first transistor and the second transistor, responsive to the second signal being asserted, the control logic is configured to turn off the first transistor, and turn on the second transistor.

Example 9 includes the gate driver of example 8, wherein the first voltage meets the threshold responsive to the diode conducting current.

Example 10 includes the gate driver of example 8, wherein the first transistor is configured to reduce a gate voltage of at least one of an insulated-gate bipolar transistor (IGBT) or a Silicon Carbide (SiC) transistor at a first rate responsive to being turned on, and the second transistor is configured to reduce the gate voltage of the at least one of the IGBT or the SiC transistor at a second rate responsive to being turned on, the second rate slower than the first rate.

Example 11 includes the gate driver of example 8, further including a timer circuit coupled to the latch, and the timer circuit is configured to begin a timer responsive to the second signal being asserted, and reset the latch responsive to the timer elapsing.

Example 12 includes the gate driver of example 8, wherein the latch is configured to deassert the second signal responsive to a timer circuit resetting the latch responsive to a timer elapsing, the timer circuit to begin the timer responsive to the second signal being asserted, and responsive to the second signal being deasserted, the control logic is configured to turn on the first transistor, and turn off the second transistor.

Example 13 includes the gate driver of example 12, wherein the first transistor is configured to adjust a gate voltage of an insulated-gate bipolar transistor from a first rate to a second rate responsive to being turned on, and the second transistor is turned off, the second rate greater than the first rate.

Example 14 includes a vehicle comprising a motor, a traction inverter coupled to the motor, the traction inverter including one or more Silicon Carbide (SiC) transistors, and one or more gate drivers coupled to a respective one of the one or more SiC transistors, a first gate driver of the one or more gate drivers coupled to a first SiC transistor of the one or more SiC transistors, the first gate driver including a comparator to assert a first signal responsive to a voltage meeting a threshold, the voltage associated with a current terminal of the first SiC transistor, a latch coupled to the comparator, the latch is configured to assert a second signal responsive to the first signal being asserted, a first transistor having a first size, a second transistor having a second size less than the first size, and control logic coupled to the latch, the first transistor and the second transistor, responsive to the second signal being asserted, the control logic is configured to turn off the first transistor, and turn on the second transistor.

Example 15 includes the system of example 14, further including a resistor network coupled to the first gate driver, a capacitor coupled to the resistor network, a first diode having a first anode and a first cathode, the first anode coupled to the resistor network and the capacitor, and a second diode having a second anode and a second cathode, the second anode coupled to the resistor network, the capacitor, and the first anode.

Example 16 includes the system of example 15, wherein the first SiC transistor is an n-channel SiC transistor having a current terminal and a gate, the current terminal coupled to the first cathode, the gate coupled to the second cathode and the first gate driver.

Example 17 includes the system of example 14, wherein the first transistor is configured to reduce a gate voltage of the first SiC transistor at a first rate responsive to the first transistor being turned on, and the second transistor is configured to reduce the gate voltage of the first SiC transistor at a second rate responsive to the second transistor being turned on, the second rate slower than the first rate.

Example 18 includes the system of example 14, wherein the first gate driver includes a timer circuit coupled to the latch, and the timer circuit is configured to begin a timer responsive to the second signal being asserted, and reset the latch responsive to the timer elapsing.

Example 19 includes the system of example 14, wherein the first gate driver further includes a timer circuit coupled to the latch, and the latch is configured to deassert the second signal responsive to the timer circuit resetting the latch responsive to a timer elapsing, the timer circuit to begin the timer responsive to the second signal being asserted, and responsive to the second signal being deasserted, the control logic is configured to turn on the first transistor, and turn off the second transistor.

Example 20 includes the system of example 14, wherein the first transistor and the second transistor are n-channel metal-oxide-semiconductor field-effect transistors, and the one or more SiC transistors are silicon carbide insulated-gate bipolar transistors.

Modifications are possible in the described examples, and other implementations are possible, within the scope of the claims.

What is claimed is:

1. A gate driver comprising:
    a comparator having a comparator output and first and second comparator inputs, in which the first comparator input is coupled to a threshold voltage terminal, and the second comparator input is adapted to be coupled: through a first resistor and a diode to a first transistor; and through the first resistor and a second resistor to a ground terminal;
    a latch having a latch input and a latch output, in which the latch input is coupled to the comparator output;
    a second transistor having a first control terminal and a first output terminal, in which the first output terminal is adapted to be coupled to a control terminal of the first transistor;
    a third transistor smaller than the second transistor, in which the third transistor has a second control terminal and a second output terminal, and the second output terminal is adapted to be coupled to the control terminal of the first transistor; and
    control logic having a logic input and first and second logic outputs, in which the logic input is coupled to the latch output, the first logic output is coupled to the first control terminal, and the second logic output is coupled to the second control terminal.

2. The gate driver of claim 1, wherein the first transistor is an insulated-gate bipolar transistor (IGBT) or a silicon carbide (SiC) transistor.

3. The gate driver of claim 1, further comprising a timer circuit coupled to the latch, in which the timer circuit is configured to: begin a timer responsive to the latch output; and reset the latch output responsive to the timer elapsing.

4. The gate driver of claim 1, wherein the control logic is configured to:
    responsive to the latch output having a first state, turn on the second transistor, and turn off the third transistor; and
    responsive to the latch output having a second state, turn off the second transistor, and turn on the third transistor.

5. The gate driver of claim 1, wherein the second comparator input is adapted to be coupled through the first resistor and a capacitor to the ground terminal.

6. The gate driver of claim 1, wherein the second and third transistors are n-channel field effect transistors.

7. A system comprising:
    a motor;
    a traction inverter coupled to the motor, the traction inverter including a silicon carbide (SiC) transistor;
    first and second resistors;
    a diode; and
    a gate driver including:
        a comparator having a comparator output and first and second comparator inputs, in which the first comparator input is coupled to a threshold voltage terminal, and the second comparator input is coupled: through the first resistor and the diode to the SiC transistor; and through the first resistor and the second resistor to a ground terminal;
        a latch having a latch input and a latch output, in which the latch input is coupled to the comparator output;
        a first transistor having a first control terminal and a first output terminal, in which the first output terminal is coupled to a control terminal of the SiC transistor;
        a second transistor smaller than the first transistor, in which the second transistor has a second control terminal and a second output terminal, and the second output terminal is coupled to the control terminal of the SiC transistor; and
        control logic having a logic input and first and second logic outputs, in which the logic input is coupled to the latch output, the first logic output is coupled to the first control terminal, and the second logic output is coupled to the second control terminal.

8. The system of claim 7, further comprising a capacitor, wherein the second comparator input is coupled through the first resistor and the capacitor to the ground terminal.

9. The system of claim 7, wherein the second comparator input is coupled through the first resistor and the diode to a current terminal of the SiC transistor.

10. The system of claim 7, wherein the second comparator input is coupled through the first resistor and the diode to the control terminal of the SiC transistor.

11. The system of claim 7, wherein the diode is a first diode, the system comprises a second diode, and the second comparator input is coupled: through the first resistor and the first diode to a current terminal of the SiC transistor; and through the first resistor and the second diode to the control terminal of the SiC transistor.

12. The system of claim 7, wherein the SiC transistor is an n-channel SiC transistor.

13. The system of claim 7, wherein the first and second transistors are n-channel field effect transistors.

14. The system of claim 7, further comprising a timer circuit coupled to the latch, in which the timer circuit is configured to: begin a timer responsive to the latch output; and reset the latch output responsive to the timer elapsing.

15. The system of claim 7, wherein the control logic is configured to:
    responsive to the latch output having a first state, turn on the first transistor, and turn off the second transistor; and
    responsive to the latch output having a second state, turn off the first transistor, and turn on the second transistor.

* * * * *